United States Patent
Kirita

(10) Patent No.: US 9,509,045 B2
(45) Date of Patent: Nov. 29, 2016

(54) EMC SHIELD APPARATUS

(71) Applicant: Mitsuru Kirita, Tokyo (JP)

(72) Inventor: Mitsuru Kirita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 88 days.

(21) Appl. No.: 14/380,796

(22) PCT Filed: Oct. 24, 2012

(86) PCT No.: PCT/JP2012/077470
§ 371 (c)(1),
(2) Date: Aug. 25, 2014

(87) PCT Pub. No.: WO2013/150676
PCT Pub. Date: Oct. 10, 2013

(65) Prior Publication Data
US 2015/0015450 A1 Jan. 15, 2015

(30) Foreign Application Priority Data
Apr. 3, 2012 (JP) ................................. 2012-084989

(51) Int. Cl.
*H01Q 1/52* (2006.01)
*H05K 9/00* (2006.01)
*H04B 1/3827* (2015.01)

(52) U.S. Cl.
CPC ............ *H01Q 1/526* (2013.01); *H04B 1/3838* (2013.01); *H05K 9/0052* (2013.01)

(58) Field of Classification Search
None
See application file for complete search history.

(56) References Cited

U.S. PATENT DOCUMENTS

| 5,394,160 A | 2/1995 | Iwasaki et al. |
| 7,142,822 B2 | 11/2006 | Tanaka et al. |
| 8,026,864 B2 | 9/2011 | Noro et al. |
| 2004/0178960 A1* | 9/2004 | Sun .......................... H01Q 1/52 343/700 MS |
| 2009/0231229 A1* | 9/2009 | Phillips ................. H01Q 9/0428 343/843 |

FOREIGN PATENT DOCUMENTS

| JP | 5-63420 | 3/1993 |
| JP | 5-183327 | 7/1993 |
| JP | 6 77874 | 3/1994 |
| JP | 9 51210 | 2/1997 |
| JP | 11 127010 | 5/1999 |
| JP | 2001 143036 | 5/2001 |
| JP | 2004 22587 | 1/2004 |

(Continued)

OTHER PUBLICATIONS

Office Action issued Jan. 27, 2015 in Japanese Patent Application No. 2014-508999 (with English translation).
Japanese Office Action issued Nov. 4, 2014, in Japan Patent Application No. 2014-508999 (with English translation).
International Search Report Issued Dec. 18, 2012 in PCT/JP12/077470 Filed Oct. 24, 2012.

(Continued)

*Primary Examiner* — Robert Karacsony
(74) *Attorney, Agent, or Firm* — Oblon, McClelland, Maier & Neustadt, L.L.P.

(57) ABSTRACT

An EMC shield apparatus has an antenna including a conductor part, a substrate, which is arranged to be separated from the antenna, and on which a circuit that processes a signal supposed to be transmitted by the antenna or a signal received by the antenna is mounted, and a shielded conductor that is connected to the conductor part of the antenna such that a closed loop circuit that surrounds the substrate is formed, and covers periphery of the substrate together with the antenna in a steric manner, keeping a distance from the substrate.

3 Claims, 1 Drawing Sheet

(56) References Cited

FOREIGN PATENT DOCUMENTS

| JP | 2004-282534 | 10/2004 |
|----|-------------|---------|
| JP | 2005 86665 | 3/2005 |
| JP | 2009-290553 | 12/2009 |
| JP | 4873143 | 2/2012 |

OTHER PUBLICATIONS

Combined Office Action and Search Report issued May 15, 2015 in Chinese Patent Application No. 201280072091.9 (with English language translation and English Translation of Category of Cited Documents).

* cited by examiner

EMC SHIELD APPARATUS

FIELD

The present invention relates to an EMC shield apparatus.

BACKGROUND

Patent Literature 1 describes an antenna apparatus in which an antenna element is configured by fixing an antenna plate, a dielectric spacer, and a ground plate by four screws. With this configuration, according to Patent Literature 1, because the antenna element can be handled as one component, it is supposed that an antenna module and the antenna apparatus can be easily assembled.

CITATION LIST

Patent Literature

Patent Literature 1: Japanese Patent No. 4873143

SUMMARY

Technical Problem

In the antenna apparatus described in Patent Literature 1, an antenna probe integrated with an antenna plate penetrate through the dielectric spacer and the ground plate, and the antenna probe is electrically and mechanically connected to a circuit board that is joined on the ground plate on the reverse side of the dielectric spacer. In this case, when an unnecessary radio wave from outside is received by the antenna plate (an antenna), noise corresponding to the unnecessary radio wave is easily transmitted from the antenna to a signal processing circuit mounted on the circuit board. Therefore, a desired signal tends to be interfered by the noise corresponding to the unnecessary radio wave, and thus there is a possibility that the S/N ratio of a signal supposed to be transmitted by the antenna or that of a signal received by the antenna is decreased.

The present invention has been achieved in view of the above problems, and an object of the present invention is to provide an EMC shield apparatus that can improve the S/N ratio of a signal supposed to be transmitted by an antenna or that of a signal received by the antenna.

Solution to Problem

In order to solve the aforementioned problems, an EMC shield apparatus according to one aspect of the present invention is constructed to include: an antenna including a conductor part; a substrate, which is arranged to be separated from the antenna, and on which a circuit that processes a signal supposed to be transmitted by the antenna or a signal received by the antenna is mounted; and a shielded conductor that is connected to the conductor part of the antenna such that a closed loop circuit that surrounds the substrate is formed, and covers periphery of the substrate together with the antenna in a steric manner, keeping a distance from the substrate.

Advantageous Effects of invention

According to the present invention, an antenna and a shielded conductor can form a closed loop circuit that surrounds a substrate, and unnecessary radio waves except for radio waves of a desired frequency band supposed to be transmitted and received by the antenna can be absorbed by the antenna and the shielded conductor to let out the unnecessary radio waves to, for example, the ground potential via the closed loop circuit. That is, it is possible to cause the antenna and the shielded conductor to function as an EMC shield for protecting the substrate from EMC noise. With this configuration, a PCA board in a space surrounded by the antenna and the shielded conductor is hardly affected by the noise corresponding to the unnecessary radio waves. That is, when unnecessary radio waves from outside are received by the antenna, it is possible to suppress transmission of the noise corresponding to the unnecessary radio waves from the antenna to a signal processing circuit (such as a transmission circuit and a reception circuit) mounted on the PCA board, thereby improving the S/N ratio of a signal supposed to be transmitted by the antenna or that of a signal received by the antenna.

DESCRIPTION OF EMBODIMENTS

Exemplary embodiments of an EMC shield apparatus according to the present invention will be explained below in detail with reference to the accompanying drawings. The present invention is not limited to the embodiments.

First Embodiment

Figure 1:
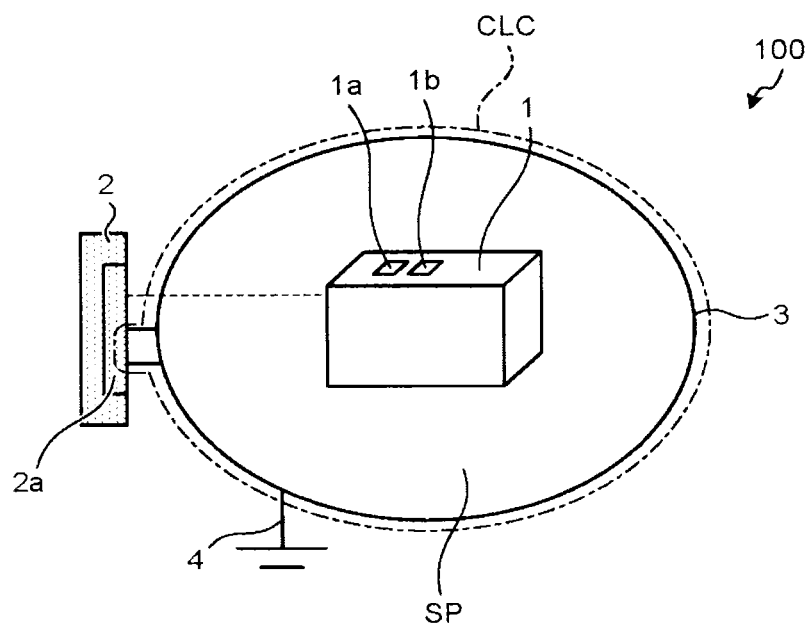
FIG. 1 depicts a configuration of an EMC shield apparatus according to a first embodiment.

An EMC (Electromagnetic Compatibility) shield apparatus 100 according to a first embodiment is explained with reference to FIG. 1. FIG. 1 depicts a schematic configuration of the EMC shield apparatus 100.

The EMC shield apparatus 100 includes an antenna 2, a PCA (Printed Circuit Assembly) board 1, and a shielded conductor 3.

The antenna 2 receives radio waves of a desired frequency band reaching from outside and transmits a radio wave of a desired frequency band to outside. The antenna 2 includes a conductor part 2a. The conductor part 2a of the antenna 2 is directly connected to the shielded conductor 3 in an electrical and mechanical manner. The conductor part 2a is formed of a conductor having a relatively high electrical conductivity such as copper and aluminum. For the antenna system of the antenna 2, any antenna system can be used as long as it is partly configured by a conductor, such as a microstrip antenna, a horn antenna, or a waveguide slot antenna.

The PCA board 1 is arranged in a space SP that is surrounded by the antenna 2 and the shielded conductor 3. The PCA board 1 is arranged to be separated from the antenna 2. A transmission circuit 1a that processes a signal supposed to be transmitted by the antenna 2 and a reception circuit 1b that processes a signal received by the antenna 2 are mounted on the PCA board 1. For example, as the PCA board 1, it is possible to use a substrate which is obtained by impregnating resin having an insulation property to a base material, and on which a circuit wiring is formed with a conductor.

The shielded conductor 3 is directly connected to the conductor part 2a of the antenna 2 in an electrical and mechanical manner. Besides, the shielded conductor 3 covers the periphery of the PCA board 1 with the antenna 2 in a steric manner while being separated from the PCA board 1. With this configuration, as indicated by the dashed line, the antenna 2 and the shielded conductor 3 can form a closed loop circuit CLC that surrounds the PCA board 1. The shielded conductor 3 is connected to the ground potential 4. The shielded conductor 3 is formed of a conductor having a relatively high electrical conductivity such as copper and aluminum.

The antenna 2 has a frequency characteristic such as that of a band pass filter, and the PCA board 1 includes, for example, a coil as a configuration for transmitting and receiving a signal between the PCA board itself and the antenna 2 in a non-contact manner. With this configuration, for example, the antenna 2 can selectively receive a signal of a desired frequency transmitted in a non-contact manner from the transmission circuit 1a on the PCA board 1 in a non-contact manner. Alternatively, for example, the antenna 2 can extract a signal of a desired frequency among the signals received from outside and further transmit the thus extracted signal to the reception circuit 1*b* in a non-contact manner.

According to this configuration, while transmitting and receiving, between the PCA board 1 and the antenna 2, a signal of a desired frequency band supposed to be transmitted and received by the antenna 2 among radio waves reaching from outside, unnecessary radio waves except for radio waves of a desired frequency band supposed to be transmitted and received by the antenna 2 can be absorbed by the antenna 2 and the shielded conductor 3 and the unnecessary radio waves can be let out to the ground potential 4 via the closed loop circuit CLC.

As described above, in the first embodiment, the antenna 2 is separated from the PCA board 1. Furthermore, the shielded conductor 3 is connected to the conductor part 2*a* of the antenna 2 and covers the periphery of the PCA board 1 together with the antenna 2 in a steric manner, keeping a distance from the PCA board 1. With this configuration, the antenna 2 and the shielded conductor 3 can form the closed loop circuit CLC that surrounds the PCA board 1, and unnecessary radio waves except for radio waves of a desired frequency band supposed to be transmitted and received by the antenna 2 can be absorbed by the antenna 2 and the shielded conductor 3, and the unnecessary radio waves can be let out to the ground potential 4 via the closed loop circuit CLC. That is, it is possible to cause the antenna 2 and the shielded conductor 3 to function as an EMC shield for protecting the PCA board 1 from EMC noise. With this configuration, the PCA board 1 in the space SP surrounded by the antenna 2 and the shielded conductor 3 is hardly affected by noise corresponding to the unnecessary radio waves. That is, when unnecessary radio waves from outside are received by the antenna, it is possible to suppress transmission of the noise corresponding to the unnecessary radio waves from the antenna 2 to a signal processing circuit (such as the transmission circuit is and the reception circuit 1*b*) mounted on the PCA board 1, thereby improving the S/N ratio of a signal supposed to be transmitted by the antenna or that of a signal received by the antenna.

Second Embodiment

Figure 2:
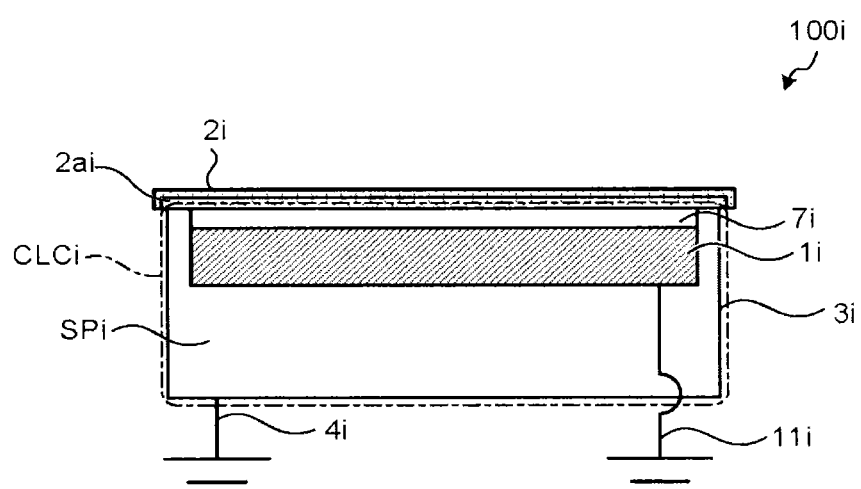
FIG. 2 depicts a configuration of an EMC shield apparatus according to a second embodiment.

Next, an EMC shield apparatus 100*i* according to a second embodiment is explained with reference to FIG. 2. FIG. 2 depicts a schematic configuration of the EMC shield apparatus 100*i*. In the following descriptions, elements of the second embodiment that are different from those of the first embodiment are mainly explained.

While a conceptual configuration of the EMC shield apparatus 100 has been explained in the first embodiment, in the second embodiment, a more practical mode of the EMC shield apparatus 100*i* is discussed.

Specifically, the EMC shield apparatus 100I includes, instead of the antenna 2, the PCA board 1, and the shielded conductor 3 (see FIG. 1), an antenna 2*i*, a PCA board 1*i*, and a shielded conductor 3*i*, respectively, and also includes a non-conductive adhesive 7*i*.

The shielded conductor 3*i* has, for example, a box shape with the top face thereof being opened, and the shielded conductor 3*i* can be obtained by, for example, forming a conductive plate (a conductor plate) into a box shape by sheet-metal processing. The antenna 2*i* has a flat-plate shape, for example, and can be formed into a lid shape that matches the box shape of the shielded conductor 3*i*. At this time, a conductor part 2*ai* of the antenna 2*i* is directly connected to the shielded conductor 31 in an electrical and mechanical manner by, for example, alloy junction or the like. In this case, the space SPi surrounded by the antenna 2*i* and the shielded conductor 3*i* can be formed into a substantially rectangular parallelepiped shape, thereby facilitating accommodation of the PCA board 1*i*.

The non-conductive adhesive 7*i* fixes the PCA board 1*i* to the antenna 2*i* at a position separated from the antenna 2*i* and in an electrically insulated state from the antenna 2*i*. In a state where a GND surface (the conductor part 2*ai*) of the antenna 2*i* and the shielded conductor 3*i* are directly in contact with each other, the non-conductive adhesive 7*i* and the PCA board 1*i* are arranged to be surrounded by the GND surface (the conductor part 2*ai*) of the antenna 2*i* and the shielded conductor 3*i*. In this arrangement, the ground potential 4*i* connected to the antenna 2*i* or to the shielded conductor 3*i* and the ground potential 11*i* connected to the PCA board 1*i* are required not to be communalized and to be provided separately as shown in FIG. 2.

By employing such a mode, a closed loop circuit CLCi is formed in such a manner that the conductor part 2*ai* of the antenna 2*i* and the shielded conductor 3*i* surround the non-conductive adhesive 7*i* and the PCA board 1*i*. With this configuration, unnecessary radio waves from outside can be absorbed by the antenna 2*i* and the shielded conductor 3*i* and let out to the ground potential 4*i* via the closed loop circuit CLCi.

As described above, in the second embodiment, the non-conductive adhesive 7*i* fixes the PCA board 1*i* to the antenna 2*i* in a state in which the PCA board 1*i* is separated from the antenna 2*i* and electrically insulated from the antenna 2*i*. With this configuration, it is possible to suppress transmission of noise corresponding to unnecessary radio waves from the antenna 2*i* to a signal processing circuit mounted on the PCA board 1*i*, and the PCA board 1*i* can be stably held.

Furthermore, in the second embodiment, because the non-conductive adhesive 7*i* electrically insulates the PCA board 1*i* from the antenna 2*i*, the closed loop circuit CLCi is formed in such a manner that the conductor part 2*ai* of the antenna 2*i* and the shielded conductor 3*i* surround the non-conductive adhesive 7*i* and the PCA board 1*i*. That is, also in the second embodiment, it is possible to cause the antenna 2*i* and the shielded conductor 3*i* to function as an EMC shield for protecting the PCA board 1*i* from EMC noise.

It should be noted that, for example, the antenna 2*i* has a frequency characteristic such as that of a band pass filter, and the PCA board 1*i* can include, for example, a coil as a configuration for transmitting and receiving a signal between the PCA board itself and the antenna 2i in a non-contact manner. Alternatively, for example, the antenna 2i has a frequency characteristic such as that of a band pass filter, and the PCA board 1i and the antenna 2i can include, as a configuration for transmitting and receiving a signal therebetween in a non-contact manner, a capacitor that is formed to sandwich the non-conductive adhesive 7i by an electrode on the side of the PCA board 1i and an electrode on the side of the antenna 2i.

With this configuration, for example, the antenna 2i can selectively receive a signal of a desired frequency transmitted in a non-contact manner from the transmission circuit 1a on the PCA board 1i in a non-contact manner (see FIG. 1). Alternatively, for example, the antenna 2i can extract a signal of a desired frequency among the signals received from outside and further transmit the extracted signal to the reception circuit 1b in a non-contact manner (see FIG. 1).

INDUSTRIAL APPLICABILITY

As described above, the EMC shield apparatus according to the present invention is useful as an EMC shield of a transmission circuit and a reception circuit.

REFERENCE SIGNS LIST 1, 1i PCA board, 2, 2i antenna, 3, 3i shielded conductor, 4, 4i ground potential, 7i non-conductive adhesive, 11i ground potential, 100, 100i EMC shield apparatus.

The invention claimed is:
1. An EMC shield apparatus comprising:
an antenna having a bandpass filter characteristic and including a conductor part;
a substrate, which is arranged to be separated from the antenna, and on which a circuit that processes a signal to be transmitted by the antenna or a signal received by the antenna is mounted, said substrate including a coil configured to transmit or receive signals between the antenna and circuit; and
a shielded conductor that is connected to a ground potential and to the conductor part of the antenna such that a closed loop circuit that surrounds the substrate is formed, and covers a periphery of the substrate together with the antenna, keeping a distance from the substrate,
wherein a signal is transmitted from the antenna to the substrate in a non-contact manner, and the substrate transmits a signal to the antenna in a non-contact manner.

2. The EMC shield apparatus according to claim 1, further comprising a non-conductive adhesive that fixes the substrate to the antenna at a position separated from the antenna and in an electrically insulated state from the antenna.

3. The EMC shield apparatus according to claim 2, wherein
the shielded conductor has a box shape with the top face thereof being opened, and
the antenna has a lid shape that matches the box shape.

* * * * *